United States Patent [19]

Nakayama

[11] Patent Number: 4,607,231

[45] Date of Patent: Aug. 19, 1986

[54] VARIABLE SWITCHED-CAPACITOR FILTER CAPABLE OF CHANGING THE FILTER CHARACTERISTIC THEREOF

[75] Inventor: Kenji Nakayama, Tokyo, Japan

[73] Assignee: NEC Corporation, Tokyo, Japan

[21] Appl. No.: 742,156

[22] Filed: Jun. 6, 1985

[30] Foreign Application Priority Data

Jun. 7, 1984 [JP] Japan ................................ 59-116929

[51] Int. Cl.[4] .......................... H03F 3/68; H03H 7/10
[52] U.S. Cl. ..................................... 330/51; 330/107; 330/124 R; 333/28 R; 333/173; 333/18
[58] Field of Search ...................... 330/107, 124 R, 51, 330/395, 304, 305; 333/18, 28 R, 173; 364/724; 375/12, 14, 15, 16

[56] References Cited

U.S. PATENT DOCUMENTS 4,500,999 2/1985 Takatori et al. .............. 333/28 R X

OTHER PUBLICATIONS

Suzuki et al., "A CMOS Switched-Capacitor Variable Line Equalizer", *IEEE Journal of Solid-State Circuits*, vol. SC-18, No. 6, Dec. 1983, pp. 700-706.

*Primary Examiner*—James B. Mullins
*Attorney, Agent, or Firm*—Sughrue, Mion, Zinn, Macpeak, and Seas

[57] ABSTRACT

An equalization circuit with switched capacitor filters, each having variable filter characteristics, that is adapted to provide power equalization on digital transmission lines that are subject to power losses for high frequency signals. The power equalization is provided automatically by switching in or out of a filter one or more of its capacitors in response to detected variations in line power levels. Identical filters are connected in parallel and alternatively applied within the equalizer circuit, the capacitor switching occurring only in a filter circuit that is not actively applied within the equalizer circuit.

7 Claims, 15 Drawing Figures

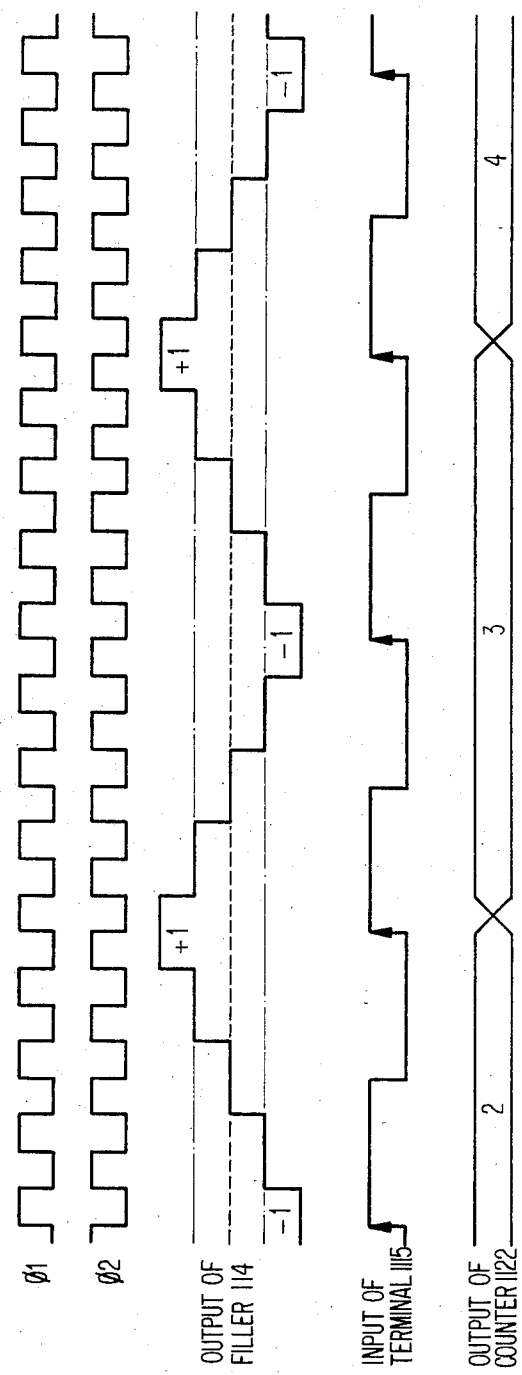

VARIABLE SWITCHED-CAPACITOR FILTER CAPABLE OF CHANGING THE FILTER CHARACTERISTIC THEREOF

BACKGROUND OF THE INVENTION

The present invention relates to a switched-capacitor filter (SCF) including switches, capacitors and an operational amplifier or amplifiers and, more particularly, to a variable switched-capacitor filter (VSCF) capable of changing the filter characteristic thereof.

A typical application of a VSCF is to an automatic line equalizer installed on a digital transmission path. There the power equalizer, commonly designated as a "$\sqrt{f}$ equalizer" because transmission loss increases dramatically as the frequency increases, is designed to minimize intersymbol interference by the application of a variable switched-capacitor filter circuit or "$\sqrt{f}$ filter". Such a VSCF can readily be manufactured in a large-scale integrated circuit configuration so that the automatic line equalizer using the VSCF can be provided in desirably small dimensions. An example of such automatic line equalizers implemented by conventional VSCFs is disclosed in a paper entitled "A CMOS Switched-Capacitor Variable Line Equalizer", by T. Suzuki et al in the IEEE Journal of Solid-State Circuit, Vol. SC-18, No. 6, December 1983, pages 700 to 706. The disclosed conventional VSCF, however, has disadvantages that substantial waveform distortions take place at the time of selective capacitor switching because the variable filter characteristic of the VSCF is discrete. The distortions result in an undesirable error rate in the transmitted data. In a two-wire communication system, for example, a transmitting mode and a receiving mode must be set up alternately with each other so that level detection is effected during the receiving mode operation and selective capacitor switching in each capacitor group is effected during the transmitting mode operation (in which a $\sqrt{f}$ equalizer implemented by an SCF is not used). This frees the equalizer output from the influence of the waveform distortions attributable to the selective capacitor switching. In a four-wire communication system, however, the transmitting mode and the receiving mode occur simultaneously so that the SCF $\sqrt{f}$ equalizer is always in operation. As a result, the equalizer output inevitably has the waveform distortions due to the selective capacitor switching.

SUMMARY OF THE INVENTION

One object of the present invention is, therefore, to provide a variable SCF free from the above-mentioned disadvantages of the prior art VSCF. According to one aspect of the invention, there is provided a switched-capacitor filter which comprises: an input terminal; an output terminal; and first and second variable switched-capacitor filter means, each having a plurality of capacitors at least one of which is selected responsive to a control signal the filter characteristic of the filter being based on the selected capacitor or capacitors. The first and second filter means are connected to a single input terminal and are adapted to receive an input signal. First switching means is provided which, during a first state, delivers a first output signal from the first variable switched-capacitor filter means to the output terminal either directly or via a sample and hold circuit and, during a second state, prohibits the first output signal from reaching the output terminal. Second switching means is provided which, during the second state, delivers a second output signal from the second variable switched-capacitor filter means to the output terminal directly or via the sample and hold circuit and, during the first state, prohibits the second output signal from reaching the output terminal. The selection of at least one capacitor in the first variable switched-capacitor filter means is performed during the second state, while the selection of at least one capacitor in the second variable switched-capacitor filter means is performed during the first state.

BRIEF DESCRIPTION OF THE DRAWINGS

The above and other objects, features and advantages of the invention will become more apparent from the following detailed description when taken in conjunction with the accompanying drawings, in which:

FIG. 12 shows a timing chart demonstrating the operation of the line equalizer shown in FIG. 7.

In the drawings, the same structural elements are represented by the same reference numerals.

DESCRIPTION OF THE PREFERRED EMBODIMENTS

Figure 1:
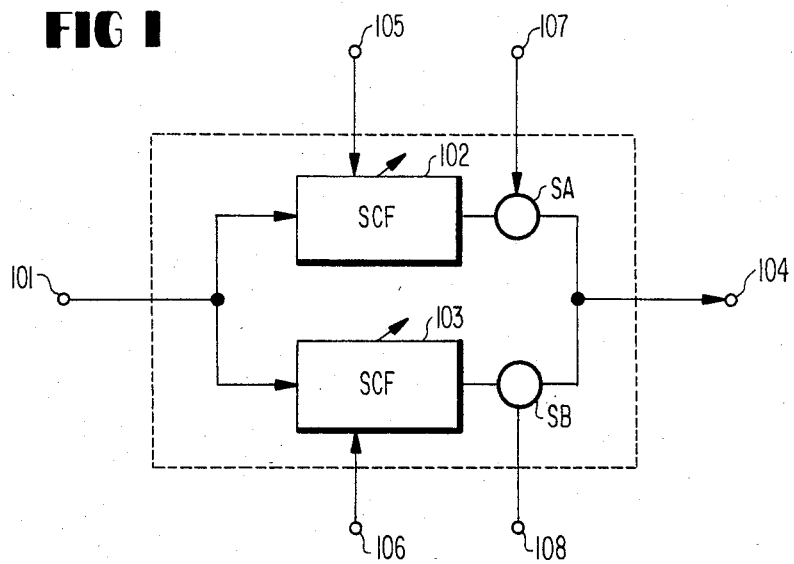
FIG. 1 is a block diagram of a first embodiment of the present invention.

Referring to FIG. 1, a first embodiment of the present invention comprises input terminals 101, 105, 106, 107 and 108, a signal output terminal 104, a first VSCF block 102, and a second VSCF block 103. The terminal 101 is connected to the blocks 102 and 103, the terminal 105 to the block 102, and the terminal 106 to the block 103. In each of the blocks 102 and 103, at least one of a plurality of capacitors is selected responsive to a control signal $S_{105}$ or $S_{106}$ applied thereto through the terminal 105 or 106, for setting up a specific filter characteristic. Meanwhile, an input signal is applied to both the blocks 102 and 103 via the terminal 101. The block 102 is connected to a switch section $S_A$ which, during a first state, passes an output signal of the block 102 therethrough to the terminal 104 and, during a second state, does not pass it. On the other hand, the block 103 is connected to a switch section $S_B$ which, during the second state, passes an output signal of the block 103 therethrough to the terminal 104 and, during the first state, does not pass it. In the embodiment, the sections $S_A$ and $S_B$ each may be constructed by simple switch elements.

Figure 3:
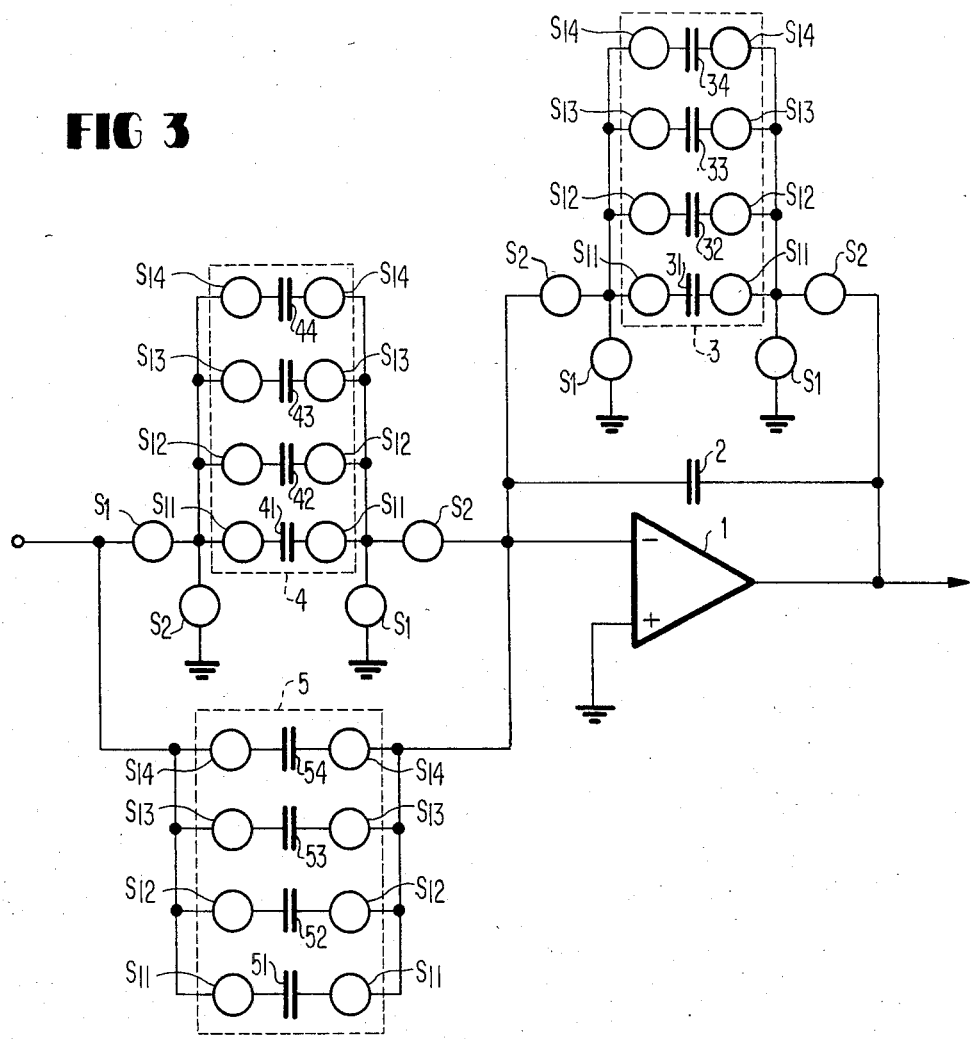
FIG. 3 is a circuit diagram of a VSCF block.
Figure 4A:
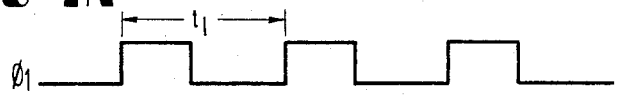
FIGS. 4A and 4B show waveforms of signals $\phi_1$ and $\phi_2$, respectively.
Figure 4B:
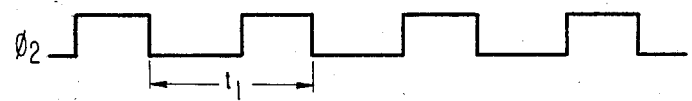

Referring to FIG. 3, the block 102 is made up of an operational amplifier (op amp) 1, a capacitor 2, a first capacitor group 3, a second capacitor group 4, a third capacitor group 5, and switches $S_1$ and $S_2$. The capacitor group 3 has the construction in which four capacitors 31, 32, 33 and 34, whose both ends are connected to switches $S_{11}$, $S_{12}$, $S_{13}$ and $S_{14}$, respectively, are connected in parallel to one other. The other capacitor groups are constructed in the same manner as the capacitor group 3. Specifically, in the capacitor group 4, capacitors 41, 42, 43 and 44 are connected in parallel, while switches $S_{11}$, $S_{12}$, $S_{13}$ and $S_{14}$ are connected to opposite ends of the capacitors 41, 42, 43 and 44, respectively in the capacitor group 5, capacitors 51, 52, 53 and 54 are connected in parallel, while switches $S_{11}$, $S_{12}$, $S_{13}$ and $S_{14}$ are connected to opposite ends of the capacitors 51, 52, 53 and 54, respectively. The switches $S_1$ are opened and closed in response to a clock signal $\phi_1$ shown in FIG. 4A, and the switches $S_2$ are opened and closed in response to a clock signal $\phi_2$ shown in FIG. 4B. Each switch is closed when the associated clock signal $\phi_1$ or $\phi_2$ is a higher voltage and is opened when it is a lower voltage. The clock signals $\phi_1$ and $\phi_2$ have the same clock frequency and period $t_1$, but their higher voltage periods do not overlap each other. The switches $S_{11}$ to $S_{14}$ are adapted to select their associated capacitors. Selection of any of the capacitors is effected by applying a selection signal having a higher voltage to the switches associated with the desired capacitor. The other block 103 has exactly the same construction as the block 102.

Assuming that the capacitor 2 has a capacitance $C_2$, the capacitors 31 to 34 have capacitances $C_{31}$ to $C_{34}$, respectively, the capacitors 41 to 44 have capacitances $C_{41}$ to $C_{44}$, respectively, and the capacitors 51 to 54 have capacitances $C_{51}$ to $C_{54}$, respectively, then the transfer function H(Z) (where Z equals $e^{j\omega T}$, $\omega$ represents an angular frequency, and T represents a sampling period) is expressed as:

$$H(Z) = \frac{C_{4i} - C_{5i}(1 - Z^{-1})}{C_2(1 - Z^{-1}) + C_{3i}} = \frac{C_{4i} - C_{5i} + C_{5i}Z^{-1}}{C_2 + C_{3i} - C_2Z^{-1}}$$

(i = 1 through 4)

Figure 5:
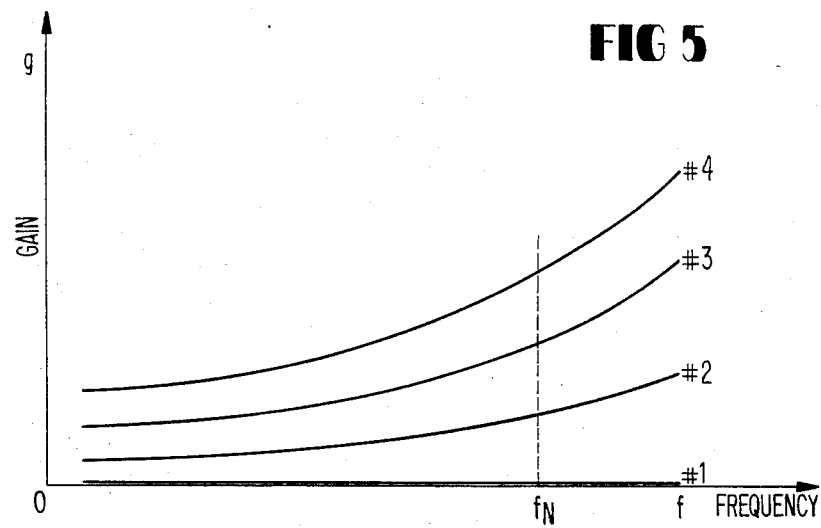
FIG. 5 shows curves representative of a frequency-to-gain characteristic of the VSCF block.

A specific example of the frequency-to-gain characteristic of the VSCF block is shown in FIG. 5. In FIG. 5, curves #1, #2, #3 and #4 represent characteristics which result from closing of the switches $S_{11}$ to $S_{14}$, respectively. Labeled $f_N$ ($=1/T$) in FIG. 5 is the Nyquist frequency.

Figure 2A:
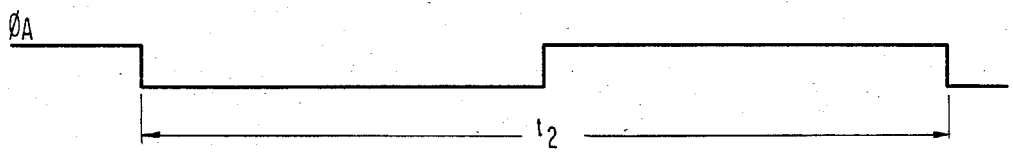
FIGS. 2A and 2B show waveforms of signals $\phi_A$ and $\phi_B$, respectively.
Figure 2B:
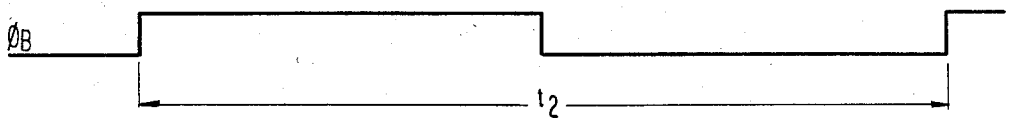

Referring again to FIG. 1, the sections $S_A$ and $S_B$ are supplied with signals $\phi_A$ and $\phi_B$ shown in FIGS. 2A and 2B, respectively. When the signals $\phi_A$ and $\phi_B$ the higher voltage and the lower voltage, respectively, the above-mentioned first state occurs. Contrary to this, in the case where the signals $\phi_A$ and $\phi_B$ are the lower voltage and the higher voltage, respectively, the above-mentioned second state occurs. The signals $\phi_A$ and $\phi_B$ have the same clock period $t_2$ which is longer than the clock period $t_1$ of the signals $\phi_1$ and $\phi_2$. The selection of the capacitor or capacitors in the block 102, i.e., the specific filter characteristics, is carried out during the second state. Likewise, the selection in the block 103 is carried out during the first state. It will therefore be seen that a transitional phenomenon due to switching of the capacitors inside the block 102 or 103 does not appear at the terminal 104.

Figure 6A:
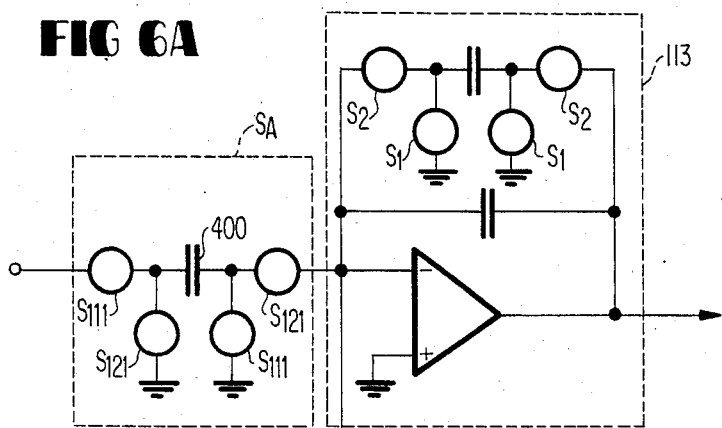
FIG. 6A is a circuit diagram of a second embodiment of the present invention.
Figure 6B:
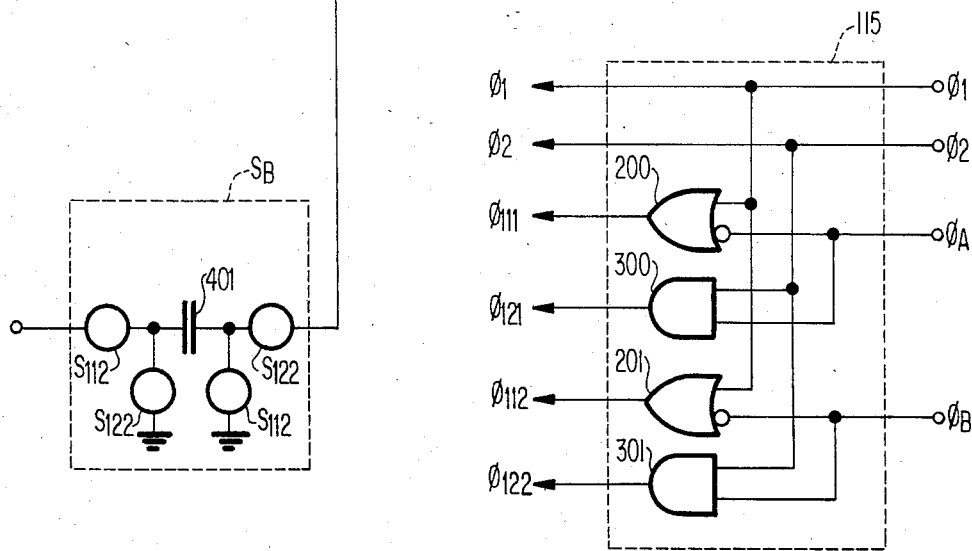
FIG. 6B is a circuit diagram of a signal generator.

Referring to FIG. 6A, a second embodiment comprises sections $S_A$ and $S_B$ and a sample and hold circuit 113. The rest of the construction shown in FIG. 6A is identical with the first embodiment. As shown, the section $S_A$ comprises a capacitor 400, and switches $S_{111}$ and $S_{121}$, while the section $S_B$ comprises a capacitor 401, and switches $S_{112}$ and $S_{122}$. Referring to FIG. 6B, a signal generator 115 is for generating signals to control the switches. The generator 115, to which the signals $\phi_1$, $\phi_2$, $\phi_A$ and $\phi_B$ shown in FIGS. 2 and 4 are applied, produces a signal $\phi_{111}$ from an OR gate 200, a signal $\phi_{112}$ from an OR gate 201, a signal $\phi_{121}$ from an AND gate 300, and a signal $\phi_{122}$ from an AND gate 301. Specifically, when the signal $\phi_A$ is the higher voltage and the signal $\phi_B$ is the lower one, there holds a condition wherein $\phi_{111}=\phi_1$, $\phi_{121}=\phi_2$, and $\phi_{112}$ are the higher voltage and $\phi_{122}$ is the lower voltage. When the signal $\phi_A$ is the lower voltage and the signal $\phi_B$ is the higher voltage, there holds a condition wherein $\phi_{112}=\phi_1$, $\phi_{122}=\phi_2$, and $\phi_{111}$ are the high voltage and $\phi_{121}$ is the lower voltage. The switches $S_1$, $S_2$, $S_{111}$, $S_{112}$, $S_{121}$, and $S_{122}$ are opened and closed in response to the signals $\phi_1$, $\phi_2$, $\phi_{111}$, $\phi_{112}$, $\phi_{121}$ and $\phi_{122}$, respectively. In this construction, when the signal $\phi_A$ is the higher voltage, the output of the block 102 is sampled in the circuit 113, while the output of the block 103 is simply stored in the capacitor 401. This relationship will be reversed when the signal $\phi_B$ is the higher voltage.

Figure 7:
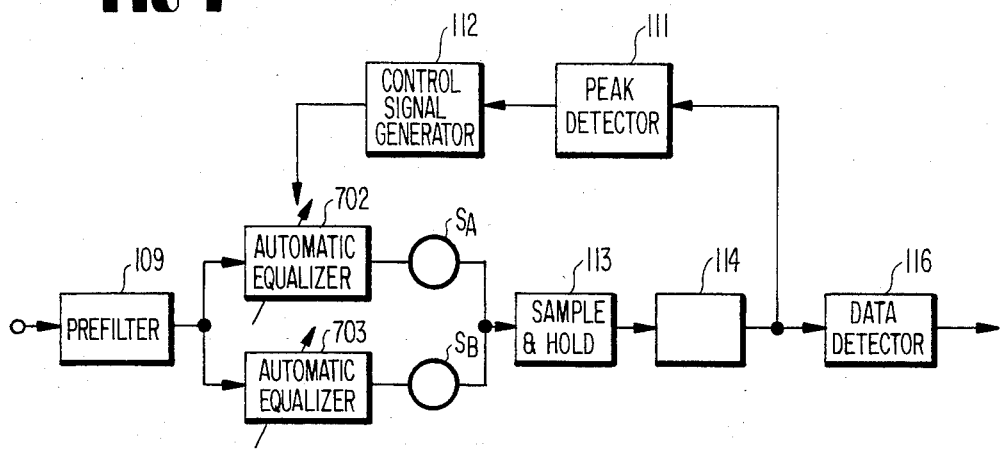
FIG. 7 is a block diagram of a line equalizer to which the present invention is applied.

Referring to FIG. 7, an automatic line equalizer, to which the present invention is applied, is comprises a prefilter 109 for removing a fold over noise, automatic equalizer sections 702 and 703 (identical in construction with the blocks 102 and 103) each for equalizing a line loss, the switch sections $S_A$ and $S_B$, the sample and hold circuit 113, a rolloff filter 114 for reducing intersymbol interference of data by wave-shaping, a peak detector 111, a control signal generator 112, and a data detector 116.

Figure 8:
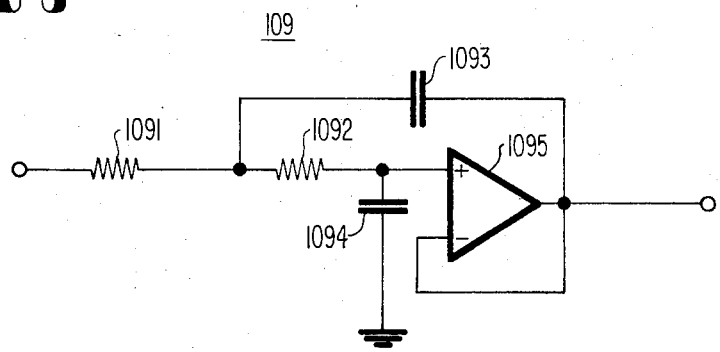
FIG. 8 is a circuit diagram of a prefilter.

Referring to FIG. 8, the prefilter 109 is made up of resistors 1091 and 1092 having resistance values $R_1$ and $R_2$, respectively, capacitors 1093 and 1094 having capacitance values $C_{1093}$ and $C_{1094}$, respectively, and an op amp 1095. The transfer function H(S) of the filter 109 (where $S=j\omega$) may be produced by:

$$H(S) = \frac{1/R_1R_2C_{1093}C_{1094}}{S^2 + \frac{R_1C_{1094} + R_2C_{1093}}{R_1R_2C_{1093}C_{1094}}S + \frac{1}{R_1R_2C_{1093}C_{1094}}}$$

Figure 9:
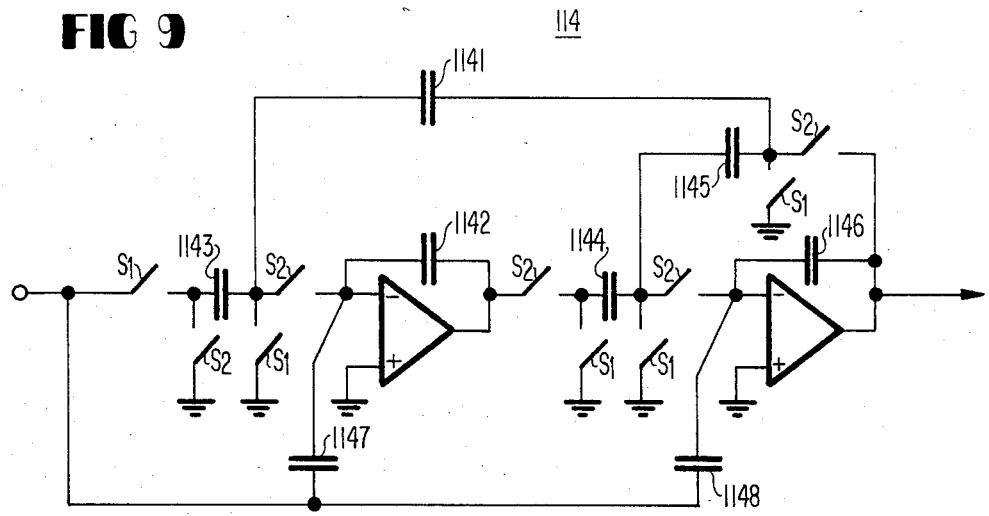
FIG. 9 is a circuit diagram of a roll-off filter.

Referring next to FIG. 9, the filter 114 is composed of an ordinary second-order low-pass SCF. Assuming that capacitors 1141 to 1148 in FIG. 9 have capacitance values $C_{1141}$ to $C_{1148}$, respectively, the transfer function H(Z) of the filter 114 may be expressed as:

$$H(Z) = \frac{C_{1142}C_{1148} - C_{1147}C_{1144} + (C_{1147}C_{1144} - 2C_{1142}C_{1148} + C_{1143}C_{1144})Z^{-1} + C_{1142}C_{1148}Z^{-2}}{C_{1142}C_{1146} + C_{1142}C_{1145} + (C_{1141}C_{1144} - 2C_{1142}C_{1146} - C_{1142}C_{1145})Z^{-1} + C_{1142}C_{1146}Z^{-2}}$$

Figure 10:
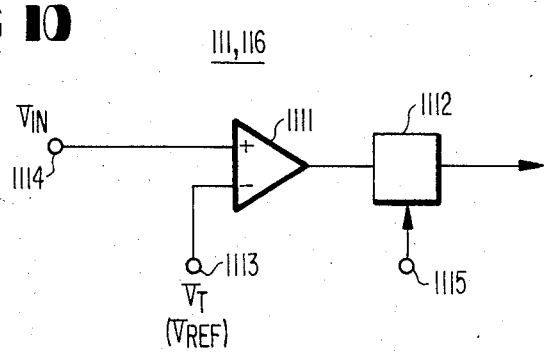
FIG. 10 is a circuit diagram of a peak detector or a data detector.

Referring to FIG. 10, each of the detector 116 and the detector 111 comprises a comparator 1111 for comparing an input signal applied to a terminal 1114 with a reference voltage applied to a terminal 1113, and a flip-flop 1112 for producing a predetermined signal in response to an output of the comparator 1111 in synchronism with a sampling clock, which is applied to a terminal 1115.

Figure 11:
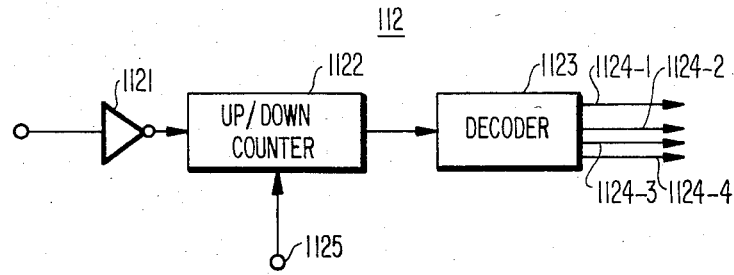
FIG. 11 is a block diagram of a control signal generator.

Referring to FIG. 11, the generator 112 includes an inverter 1121, an up-down counter 1122, and a decoder 1123.

The equalizer shown in FIG. 7 changes its characteristic as will be described with reference to FIG. 12 as well. The detector 116 determines that an output of the filter 114 is a logical "1" or a logical "0" (hereunder referred to simply as "1" and "0", respectively.) Specifically, the comparator 1111 of the detector 116 compares an output $V_{114}$ of the filter 114 applied to the terminal 1114 with a threshold voltage $V_T$ and, if $V_T < V_{114}$, produces "1" and, if $V_T > V_{114}$, produces "0". The output of the comparator 1111 is sampled by the flip-flop 1112 at predetermined sampling timings. The sampling timings may be obtained from timing pulses provided by applying an output of the filter 114 to a tank circuit or like timing extractor means (not shown). The timing pulses have a period $t_3$ which is longer than the above-mentioned period $t_1$. The output $V_{114}$ of the filter 114 is also routed to the detector 111 and compared thereby with a reference voltage $V_{ref}$. The reference voltage $V_{ref}$ is adapted to provide a reference level. The output of the detector 111 is applied to the generator 112. In the generator 112, the counter 1122 is decremented by one if the output of the detector 111 is "1" and incremented by one if it is "0", in synchronism with the data detection output from the detector 116 coming in through a terminal 1125. Counts "1" through "4", which are the contents of the counter 1122, correspond in one-to-one relation with the characteristic curves #1 through #4 of FIG. 5. The decoder 1123, decoding an output of the counter 1122, selects any of switches in the section 702 if the signal $\phi_B$ is high voltage and any of switches in the equalizer section 703 if the signal $\phi_A$ is the higher voltage. That is, the decoder 1123 delivers a signal for closing one of the switches $S_{11}$ through $S_{14}$ over one of signal lines 1124-1 through 1124-4. In this manner, automatic line equalization is accomplished without being affected by waveform distortions which result from switching of filter characteristic.

While this invention has thus for been described in conjunction with the preferred embodiment thereof, it will now readily be possible for those skilled in the art to put this invention into practice in various other manners.

What is claimed is:

1. A switched-capacitor filter responsive to control signals for changing its filter characteristics comprising:
   first and second variable switched-capacitor filter means, each such means having a plurality of capacitors at least one of which is selected in response to a control signal, each such means adapted to change its filter characteristic based on the selected capacitor or capacitors and each such means being adapted to receive the same input signal;
   first switching means and second switching means connected at a common output point;
   said first switching means also being connected to said first filter means and being adapted, during a first state, to pass a first output signal from said first variable switched-capacitor filter means to said output point and, during a second state, to prevent the first output signal from reaching said output terminal; and
   said second switching means also being connected to said second filter means and being adapted, during said second state, to pass a second output signal from said second variable switched-capacitor filter means to said output point and, during said first state, to prevent the second output signal from reaching said output terminal;
   said selection of at least one capacitor in said first variable switched-capacitor filter means in response to said control signals being performed during said second state, said selection of at least one capacitor in said second variable switched-capacitor filter means in response to said control signals being performed during said first state.

2. A switched capacitor filter, as claimed in claim 1, including a means connected at said common output point for storing said first or second output signal.

3. A switched capacitor filter, as claimed in claim 1, including a control means adapted to receive said first or second output signal and to generate said control signal input to said filter means.

4. A switched capacitor filter, as claimed in claim 3, wherein the control means comprises a source for a reference signal, a comparator means for generating a difference signal representing the difference between said output signal and said reference signal and a decoder means for converting the difference signal to said control signal.

5. In a variable line equalizer having switched capacitor filter means adapted to receive an input signal and produce an equalized output signal, signal detection means for comparing said output signal to a reference and control means responsive to said signal detection means for selectively adjusting the characteristics of said filter means, the improvement wherein:
   said switched capacitor filter means comprises substantially identical first capacitive means and second capacitive means connected in parallel between input and output points, each such capacitive means having a plurality of selectively activated capacitors and means for selecting at least one of said capacitors in response to a signal from said control means and each such capacitive means being selectively switched either to block said input signal or to produce an equalized output signal, the selection of capacitors in each capacitive means occurring only when such means is blocking said input signal.

6. The improved variable line equalizer, as claimed in claim 5, wherein said first capacitive means also includes a first switching means adapted during a first state to facilitate the generation of an equalized output signal and during a second state to block the generation of such signal, wherein said second capacitor means includes a second switching means adapted during said second state to facilitate the generation of an equalized output signal and during said first state to block the generation of such signal, said first and second switching means being switched alternatively and periodically between said first and second states.

7. The improved variable line equalizer, as claimed in claim 5, wherein said equalized output signal is applied to a store and hold circuit.

* * * * *